United States Patent
Tanaka et al.

(10) Patent No.: US 8,855,731 B2
(45) Date of Patent: Oct. 7, 2014

(54) SUPERCONDUCTING SWITCH, SUPERCONDUCTING MAGNET AND MRI

(75) Inventors: Hideki Tanaka, Hitachinaka (JP);
Tsuyoshi Wakuda, Hitachinaka (JP);
Motomune Kodama, Hitachi (JP);
Akifumi Matsuda, Machida (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/540,929

(22) Filed: Jul. 3, 2012

(65) Prior Publication Data

US 2013/0012392 A1 Jan. 10, 2013

(30) Foreign Application Priority Data

Jul. 5, 2011 (JP) .................................. 2011-148757

(51) Int. Cl.
*H01B 12/00* (2006.01)
*H01L 39/20* (2006.01)
*H01F 6/00* (2006.01)
*G01R 33/3815* (2006.01)

(52) U.S. Cl.
CPC ............ *H01L 39/20* (2013.01); *G01R 33/3815* (2013.01); *H01F 6/008* (2013.01); *Y10S 505/86* (2013.01)
USPC .......................................... 505/211; 505/860

(58) Field of Classification Search
USPC ............................................... 505/211, 860
See application file for complete search history.

(56) References Cited

U.S. PATENT DOCUMENTS

| | | | | |
|---|---|---|---|---|
| 7,608,849 | B2 * | 10/2009 | Ino et al. ............................. | 257/4 |
| 7,718,033 | B1 * | 5/2010 | Kostic et al. ..................... | 159/49 |
| 2002/0189533 | A1 * | 12/2002 | Kim et al. ....................... | 117/101 |
| 2005/0074220 | A1 * | 4/2005 | Rey .................................. | 385/141 |
| 2008/0061786 | A1 * | 3/2008 | Fukuda et al. ................. | 324/322 |
| 2008/0315255 | A1 * | 12/2008 | Maa et al. ....................... | 257/190 |
| 2010/0026447 | A1 * | 2/2010 | Keefe et al. .................. | 338/32 S |
| 2010/0173784 | A1 * | 7/2010 | Lee et al. ........................ | 505/237 |
| 2011/0028327 | A1 * | 2/2011 | Kodama et al. ................ | 505/211 |

FOREIGN PATENT DOCUMENTS

| | | |
|---|---|---|
| JP | H11-008418 A | 1/1999 |
| JP | 2003-142744 A | 5/2003 |
| JP | 2006-228797 A | 8/2006 |

OTHER PUBLICATIONS

"Magnesium Diboride Thin Films and Devices". Cui, Yi. Pennsylvania State University, Doctorate Thesis, 2007.*

* cited by examiner

*Primary Examiner* — Paul Wartalowicz
(74) *Attorney, Agent, or Firm* — Volpe and Koenig, P.C.

(57) ABSTRACT

A superconducting switch is provided in which the structural strength of the superconducting switch is kept, and thermal efficiency between a superconducting film and a heater is high when an ON state (superconducting state) and an OFF state (normal conducting state) of the superconducting switch are switched. The superconducting switch includes a substrate, a heater for generating heat by energization, a conductive film, and a $MgB_2$ film evaporated on the conductive film. The heater, the conductive film and the $MgB_2$ film are laminated in this order on one surface of the substrate.

9 Claims, 5 Drawing Sheets

SUPERCONDUCTING SWITCH, SUPERCONDUCTING MAGNET AND MRI

BACKGROUND OF THE INVENTION

1. Field of the Invention

The present invention relates to a superconducting switch, a superconducting magnet and an MRI.

2. Description of the Related Art

When a superconducting loop circuit is formed of a superconducting coil and a superconducting switch, a superconductor used for the superconducting switch is generally selected from superconductors used for the superconducting coil. Although there are an immersion cooling method and a conduction cooling method as cooling means of a superconductor, the same cooling method is usually adopted for the superconducting coil and the superconducting switch constituting a certain superconducting circuit.

The superconducting switch generally performs switching by heating the superconductor by a heater. When the superconductor is cooled to the critical temperature or lower, the resistance becomes zero (ON state), and when heated to the critical temperature or higher, the superconductor becomes a normal conductor and a resistance is generated (OFF state).

At the time of excitation of a superconducting magnet, the superconducting switch is placed in the OFF state, and most of the current supplied from an excitation power supply is made to flow through the superconducting magnet. In order to speed up ON/OFF switching of the superconducting switch or in order to suppress a refrigerant evaporation amount during the switching, a temperature difference between the temperature of the superconducting switch in the ON state and the critical temperature is preferably as small as possible. On the other hand, if the set temperature of the superconducting switch in the ON state is close to the critical temperature of the superconductor, when disturbance is applied to the superconducting switch, the temperature of the superconductor approaches the critical temperature and quenching easily occurs. Thus, the stability of the superconducting switch becomes low.

Since a low temperature superconductor such as NbTi is generally cooled by liquid helium, in the superconducting switch using the low temperature superconductor, the temperature in the ON state is the liquid helium temperature (about 4K) and the temperature in the OFF state is approximately the critical temperature (about 9K). In this case, the temperature of the superconductor of the superconducting switch is raised by about 5K by heating using a heater.

Recently, high temperature superconductors are found, and the critical temperature of the superconductor becomes high. For example, when the superconducting switch using the high temperature superconductor with a critical temperature of 90K is used in liquid helium, the temperature of the superconducting switch is required to be raised from 4K to 90K. In order to efficiently perform this heating, heat transfer efficiency between a superconducting film and a heater is required to be enhanced.

For example, patent document 1 (JP-A-2003-142744) discloses a superconducting switch using a high temperature superconducting film, and YBCO and the like are exemplified as the high temperature superconductors.

However, in the patent document 1, since an insulating substrate having a thickness sufficient to keep the strength is included between the superconducting film and a heater, there is a problem that thermal capacity of the insulating substrate existing between the superconducting film and the heater is large.

SUMMARY OF THE INVENTION

An object of the invention is to provide a superconducting switch in which the strength of the superconducting switch is kept and thermal efficiency between a superconducting film and a heater is high.

In order to achieve the object, according to an aspect of the invention, a superconducting switch includes a substrate, a heater for generating heat by energization, a conductive film and a $MgB_2$ film evaporated on the conductive film. The heater, the conductive film and the MgB2 film are laminated in this order on one surface of the substrate.

According to the aspect of the invention, while the strength of the superconducting switch is kept, the thermal efficiency between the superconducting film and the heater can be raised.

DESCRIPTION OF THE PREFERRED EMBODIMENTS

Hereinafter, embodiments of the invention will be described.

Embodiment 1

Figure 1B:
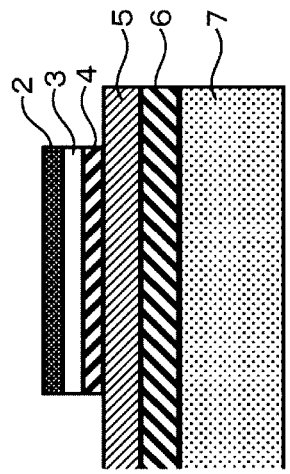
FIG. 1B is a partial sectional view thereof.
Figure 1A:
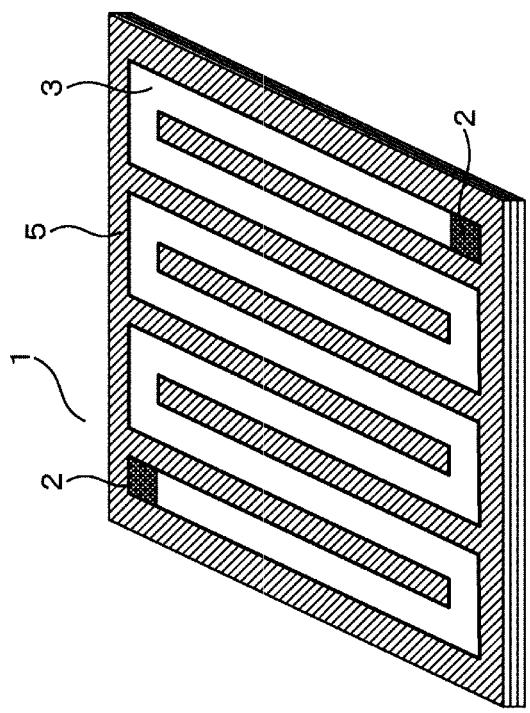
FIG. 1A is a perspective view of a superconducting switch.

FIG. 1A is a perspective view of a superconducting switch 1 common to respective embodiments, and FIG. 1B is a partial sectional view thereof. Since components except a substrate 7 are film-like, the thickness of the substrate 7 is made a sufficient thickness to keep the rigidity of the superconducting switch 1. A heater 6 is a heating body for switching between the ON state and the OFF state of the superconducting switch 1, and is connected to a not-shown heater power supply. The heater 6 can be formed of a metal foil or a metal foil cut into a circuit pattern shape, and can also be formed by evaporating a circuit pattern on the substrate 7. An insulating film 5 is a film to secure electrical insulation between the heater 6 and a conductive film 4. The conductive film 4 can be formed by evaporating a conductive material on the insulating film 5. The conductive film 4 is preferably formed of an evaporated metal film or a conductive ceramic. The conductive film 4 is electrically connected to a $MgB_2$ film 3. The $MgB_2$ film 3 can be formed by evaporating $MgB_2$ on the conductive film 4. In order to lengthen the length of a circuit made of the $MgB_2$ film 3 on the substrate 7 having a specific size, a meander circuit is formed as shown in FIG. 1. At this time, the conductive film 4 is also preferably matched to the shape of the $MgB_2$ film 3. Electrodes 2 are provided only on both ends of the meander circuit formed of the $MgB_2$ film 3, and are connected to a not-shown superconducting coil 10 and the like.

Figure 2:
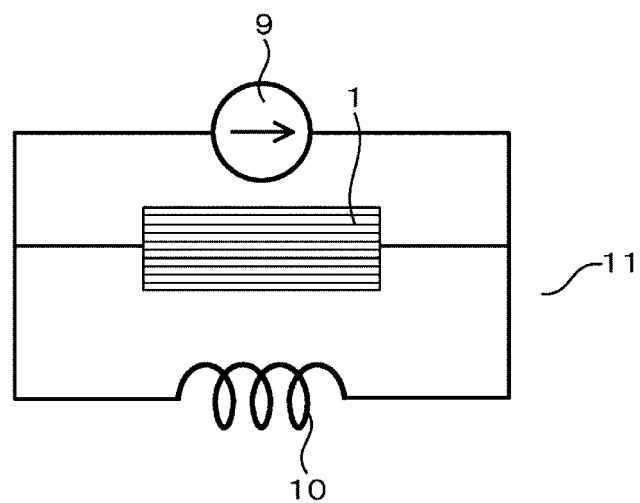
FIG. 2 is a view showing a schematic structure of a superconducting magnet.

FIG. 2 shows a schematic structure of a superconducting magnet 11. The superconducting switch 1 is cooled by a refrigerant, such as liquid helium, or a helium gas to a temperature at which the $MgB_2$ film 3 is placed in the superconducting state. When the superconducting coil 10 is excited, the heater 6 is energized and the superconducting switch 1 is placed in the OFF state, so that a specific resistance value R is generated in the superconducting switch 1. When inductance of the superconducting coil 10 is L, current flowing through the superconducting coil 10 is $I_L$, and current flowing through the superconducting switch is $I_K$, the relation of $L(dI_L/dt)$ =$RI_R$ is established. Thus, the resistance value of the superconducting switch 1 in the OFF state is determined by the inductance L of the superconducting coil and the sweep speed $dI_L/dt$ of the current flowing through the superconducting coil 10. After the current flowing through the superconducting coil 10 reaches a specific value, heating by the heater 6 is stopped, and the superconducting switch 1 is placed in the ON state. Then, a superconducting loop is formed of the superconducting coil 10 and the superconducting switch 1, and a persistent current mode becomes possible.

The amount of heating by the heater to switch the superconducting switch into the OFF state is preferably as small as possible. As compared with a $MgB_2$ wire, the critical current density of the $MgB_2$ film is improved by a factor of about 100. Thus, when the superconducting switch is formed of the $MgB_2$ film, the volume of the switch can be made small, and therefore, the thermal capacity is reduced. When the thermal capacity is reduced, the amount of heating by the heater can be suppressed, and the response to the heat of the heater can be quickened. On the other hand, it is ideal that the temperature in the ON state is sufficiently lower than the critical temperature, and the possibility that the superconducting switch 1 is quenched is low. In these two points, in this embodiment, since the temperature in the ON state is set to about 4K, and the temperature in the OFF state can be set to about 20K, the temperature difference between both the states is small. That is, in the OFF state, since it is not necessary to perform heating to about 100K unlike an oxide superconductor, the amount of heating by the heater may be small. Besides, since 4K in the ON state is sufficiently low as compared with the critical temperature of 20K, the setting is excellent in that the possibility that the superconducting switch 1 is quenched becomes low. Further, since a member to disturb heat transfer, such as the substrate 7, is not included between the heater 6 and the $MgB_2$ film 3, the heat of the heater 6 can be efficiently transferred to the $MgB_2$ film 3. The $MgB_2$ film 3, the conductive film 4, the insulating film 5 and the heater 6 are laminated, and these are made to be film-like, so that the contact areas of the respective films are increased, and heat transfer from the heater 6 to the $MgB_2$ film can be efficiently performed. Besides, since the heater 6 is provided between the $MgB_2$ film 3 and the substrate 7, while the strength of the superconducting switch 1 is kept by the substrate 7, the heat transfer from the heater 6 to the $MgB_2$ film 3 can be efficiently performed.

The superconducting switch 1 of the embodiment is manufactured mainly by an evaporation method, and, for example, the insulating film 5, the conductive film 4 and the $MgB_2$ film 3 are formed in one evaporator. Thus, the superconducting switch is excellent also in that the manufacture is easy.

Since the $MgB_2$ film 3 of the embodiment is manufactured by evaporating $MgB_2$ on the conductive film 4, the critical current density can be made higher than that of a $MgB_2$ superconducting wire manufactured by a powder-in-tube method or the like. This is superior in establishing compatibility between the securement of the current capacity of the superconducting switch 1 in the ON state and the occurrence of the specific resistance value in the OFF state.

The resistance value of the superconducting switch 1 in the OFF state is determined by the resistivity, film thickness, film width and film length along the current flow direction of the $MgB_2$ film 3 and the resistivity, film thickness, film width and film length along the current flow direction of the conductive film 4 at the temperature of the superconducting switch 1 in the OFF state. Since the film thickness of the $MgB_2$ film 3 relates also to the current capacity in the ON state, the resistance value in the OFF state is preferably controlled by the film thickness of the conductive film 4, which has relatively high selectiveness.

Since an expansion coefficient and a contraction coefficient vary according to a material, when the film-like superconductor is formed, attention must be paid to the deterioration of the superconductor due to temperature change. This is not limited to the $MgB_2$ film 3. In general, a member adjacent to the superconductor is selected from members whose thermal expansion coefficients are close to that of the superconductor. In this embodiment, with respect to the thermal expansion coefficient of the conductive film 9, the conductive film 4 is formed of a material whose thermal expansion coefficient is within ±10% of the thermal expansion coefficient of the $MgB_2$ film 3. By this, a difference in expansion (contraction) between the $MgB_2$ film 3 and the conductive film 4 due to heat becomes small, and the superconductor becomes hard to deteriorate.

Figure 3:
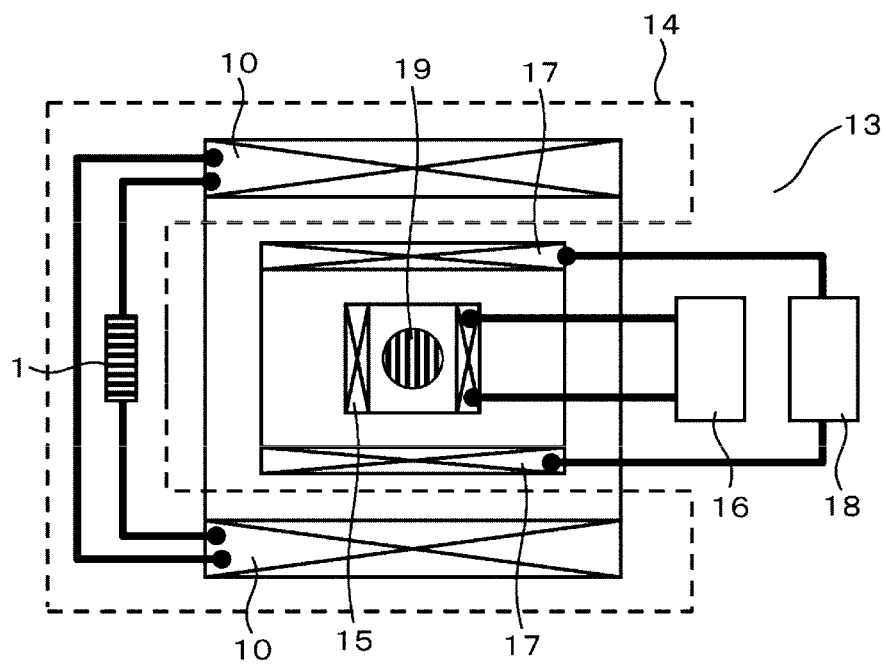
FIG. 3 is a view showing an example of an MRI.

FIG. 3 shows an example of an MRI. The superconducting switch 1, together with the superconducting coil 10, is housed in a cryogenic vessel 14, and is cooled by liquid helium or helium gas. A persistent current flowing through the superconducting switch 1 and the superconducting coil 10 generates a static magnetic field having high temporal stability at the position of a measurement object 19. As the intensity of the static magnetic field becomes high, the nuclear magnetic resonance frequency becomes high, and the nuclear magnetic resonance signal intensity also becomes high. A gradient field coil 17 is supplied with a current, which is temporarily changed as necessary, from a gradient field amplifier 18, and generates a static magnetic field having a spatial distribution at the position of the measurement object 19. Further, an RF (Radio Frequency) antenna 15 and an RF receiver-transmitter 16 are used to apply the magnetic field with the nuclear magnetic resonance frequency to the measurement object, and a reactive signal is measured, so that sectional image diagnosis of the measurement object 19 becomes possible.

Embodiment 2

Figure 4A:
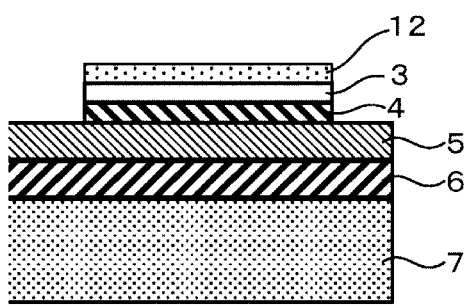
FIGS. 4A and 4B are schematic sectional views of a superconducting switch of embodiment 2.
Figure 4B:
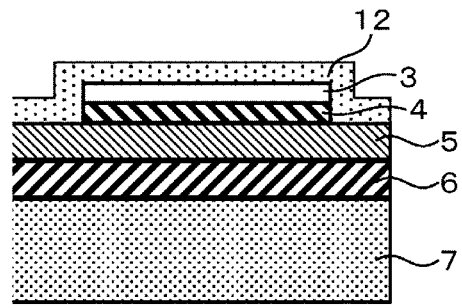

In an embodiment described below, only different points from the embodiment 1 will be described. FIGS. 4A and 4B are partial sectional views of a superconducting switch 1 in which a protecting film 12 is laminated. The protecting film 12 is provided on a surface (cooling surface) of a $MgB_2$ film at an opposite side to a substrate. In FIG. 4A, the protecting film 12 is provided only on a $MgB_2$ film 3, and in FIG. 4B, the protecting film 12 is provided to cover not only the $MgB_2$ film 3 but also a conductive film 4 and an insulating film 5.

In this embodiment, the $MgB_2$ film 3 in the OFF state does not directly exchange heat to liquid helium or helium gas, but exchanges heat through the protecting film 12. When the protecting film 12 exists, as compared with a case where the $MgB_2$ film 3 is directly exposed to helium and is cooled, the $MgB_2$ film 3 is hard to cool. The protecting film 12 preferably has a thermal conductivity of 10 W/m/K or more.

The $MgB_2$ film 3 generates heat by disturbance, and the temperature locally rises from 4K of the ON state. However, since the critical temperature of the $MgB_2$ film 3 is as high as about 20K, slight delay of cooling by the existence of a temperature margin due to the protecting film 12 is allowable, and therefore, the protecting film 12 can be arranged. When the protecting film 12 is arranged, since heating of the $MgB_2$ film 3 is facilitated by the protecting film 12 when the OFF state is changed to the ON state, heater efficiency is improved. Besides, when the respective films are laminated on the substrate 7, peeling may occur. However, as in FIG. 4B, when the protecting film 12 is provided on the whole, the respective films can be made not to be easily peeled.

Embodiment 3

Figure 5:
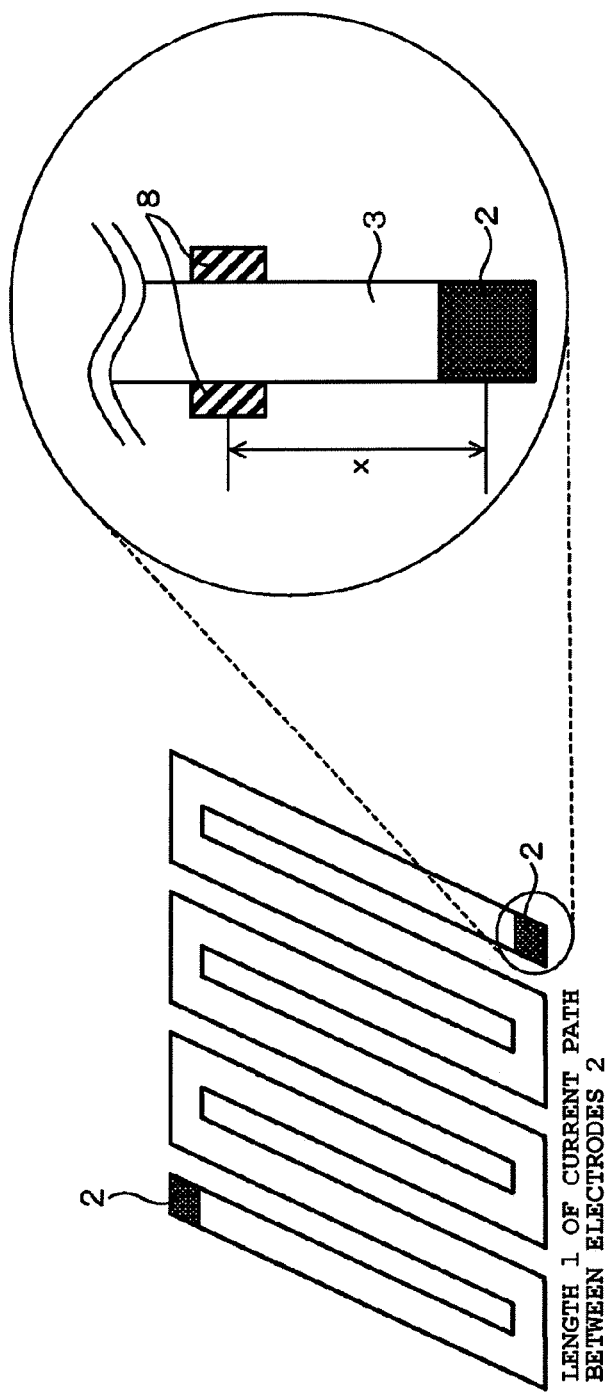
FIG. 5 is a view showing an arrangement example of a heater terminal.

FIG. 5 shows an arrangement example of a heater electrode couple 8. In this embodiment, a conductive film 4 functions also as a heater. When a superconducting switch 1 is placed in the OFF state, and a superconducting coil 10 is excited, the electrical potential difference $RI_R$ is applied between both ends of an electrode 2, both ends of a $MgB_2$ film 3, and both ends of the conductive film 4. For example, when the electrical potential of one end is zero (volt), the other end has the electrical potential of $RI_R$ (volt). As shown in FIG. 5, consideration is given to a case where the heater electrode couple 8 are placed at two points of the conductive film 4 equally spaced from one end of the electrode 2. When the length of a current path, which is made of the $MgB_2$ film 3 and the conductive film 4, between both the electrodes 2 is 1, the distance from one end (electrode 2) of the current path to each of the heater electrode couple 8 is x, and the electrical potential at one end of the electrode is zero (volt), the electrical potentials at two places of the heater electrode couple 8 are equal and are $RI_R x/1$ (volt). This means that a not-shown second heater power supply is connected to the heater electrode couple 8, and heater current can be applied to the conductive film 4. Even if DC voltage is applied to the heater electrode couple 8 from the second heater power supply, since this electrical potential difference is applied only in the direction (horizontal direction in the extended figure in FIG. 5) of connecting the heater electrode couple, no influence is exerted on both ends of the electrode 2.

As described above, when the conductive film 4 is also made to have the function as the heater, the $MgB_2$ film 3 can be efficiently heated.

Embodiment 4

Figure 6:
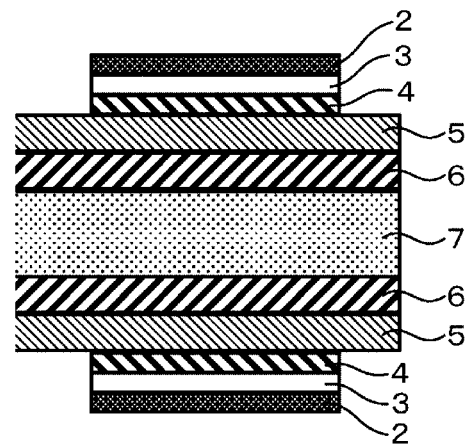
FIG. 6 is a schematic sectional view of a superconducting switch of embodiment 4.

FIG. 6 is a schematic sectional view showing a superconducting switch 1 in which a heater 6, an insulating film 5, a conductive film 4, a $MgB_2$ film 3 and an electrode 2 are laminated on both surfaces of a substrate 7. As stated above, both the surfaces are used, and the installation space of the superconducting switch 1 can be decreased.

Embodiment 5

Figure 7:
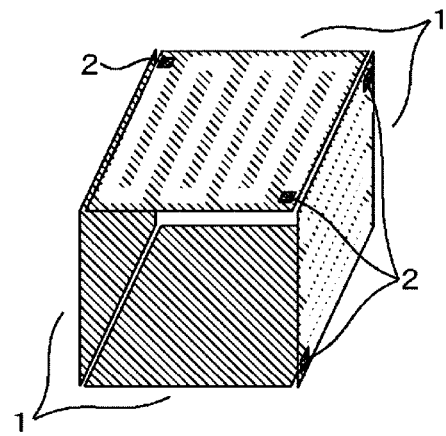
FIG. 7 is a view showing a schematic structure of superconducting switches connected in parallel to each other.

FIG. 7 is a schematic structural view showing a case where superconducting switches 1 are connected in parallel to each other and are used. The current capacity of one of the superconducting switches 1 in the ON state is designed by the critical current density, film thickness and film width of a $MgB_2$ film 3. If the film thickness and the film width are increased, the current capacity can be increased. However, if the film thickness is increased, the critical current density is reduced. Besides, if the film thickness and the film width are increased, the resistance value of the $MgB_2$ film 3 in the OFF state is excessively decreased. Accordingly, the current capacity of one of the superconducting switches 1 is limited. Then, in order to satisfy the current capacity required in a persistent current mode, the superconducting switches 1 are connected in parallel to each other. FIG. 7 shows a case where the four superconducting switches 1 are used in parallel to each other. Four parallel current leads (not shown) divided from a current lead (not shown) connected to a superconducting coil are used, and are connected to four electrodes (two of them are not shown) on the near side in FIG. 7. Further, four current leads are extended from four electrodes (two of them are not shown) on the far side in FIG. 7, are combined into one and are connected to the superconducting coil. For example, the superconducting switches 1 can be arranged laterally on one plate. However, in consideration of that the current is uniformly distributed, the superconducting switches 1 connected in parallel to each other are made geometrically symmetrical, and are ideally arranged as shown in FIG. 7 so that inductances of the superconducting switches 1 are made uniform. Although this embodiment illustrates the case where the parallel number is four, the parallel number is arbitrary. Besides, it is also important that connection resistances between the superconducting switches 1 and the current leads are made uniform in order to make uniform the currents among the superconducting switches 1.

When n superconducting switches are connected in parallel to each other, although the current capacity in the ON state is increased by a factor of about n, the resistance value in the OFF state is reduced to 1/n. In order to increase the resistance value in the OFF state, the following embodiment is used.

Embodiment 6

Figure 8:
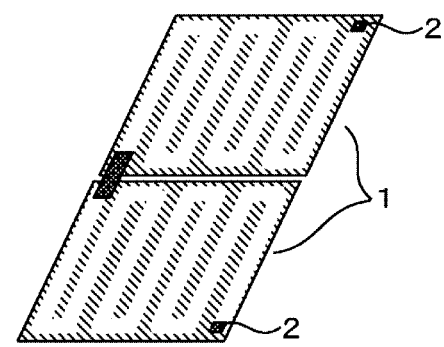
FIG. 8 is a view showing a schematic structure of superconducting switches connected in series to each other.

FIG. 8 shows a schematic structure of a case where superconducting switches 1 are connected in series to each other and are used. When the resistance value in the OFF state becomes lower than a desired value because the current capacity in the ON state is secured, as in this embodiment, the superconducting switches 1 are connected in series to each other. When m superconducting switches 1 are connected in series to each other, the current capacity in the ON state is not changed, and the resistance value in the OFF state can be increased by a factor of about m. The parallel connection shown in FIG. 7 can also be used at the same time.

What is claimed is:
1. A superconducting switch comprising:
a substrate;
a conductive film;
a $MgB_2$ film evaporated on the conductive film;
a current path made of the $MgB_2$ film; and
an electrode couple provided near an end of the current path, the electrode couple including heater electrodes provided on the conductive film at two points such that the heater electrodes sandwich the current path and are equally spaced from the end of the current path whereby the conductive film functions as a heater.

2. The superconducting switch according to claim 1, wherein a protecting film having a thermal conductivity of 10 W/m/K or more is laminated on a surface of the $MgB_2$ film opposite to the substrate side.

3. A superconducting magnet comprising a plurality of superconducting switches according to claim 1, wherein the superconducting switches are connected in series and/or in parallel to each other.

4. The superconducting switch according to claim 1, wherein a thermal expansion coefficient of the conductive film is within ±10% of a thermal expansion coefficient of the $MgB_2$ film.

5. The superconducting switch according to claim 1, wherein the conductive film is a conductive ceramic.

6. The superconducting switch according to claim 1, wherein a length from the electrode couple to one end of the current path is more than two times longer than a length from the electrode couple to another end of the current path.

7. The superconducting switch according to claim 1, wherein the current path is meandering.

8. A superconducting magnet comprising:
a superconducting switch according to claim 1; and
a superconducting coil.

9. An MRI comprising a superconducting magnet according to claim 8.

\* \* \* \* \*